US008705906B2

United States Patent
Im et al.

(10) Patent No.: US 8,705,906 B2
(45) Date of Patent: Apr. 22, 2014

(54) PHOTOELECTRIC CONVERSION MODULE

(75) Inventors: Young-Min Im, Songpa-gu (KR); Hwe-Kyung Kim, Dongjak-gu (KR)

(73) Assignee: Korea Electronics Technology Institute, Seongnam-Si, Gyeonggi-do (KR)

( * ) Notice: Subject to any disclaimer, the term of this patent is extended or adjusted under 35 U.S.C. 154(b) by 368 days.

(21) Appl. No.: 12/688,440

(22) Filed: Jan. 15, 2010

(65) Prior Publication Data

US 2010/0272388 A1    Oct. 28, 2010

(30) Foreign Application Priority Data

Apr. 23, 2009  (KR) .................. 10-2009-0035363
Jun. 24, 2009  (KR) .................. 10-2009-0056421

(51) Int. Cl.
G02B 6/12    (2006.01)
G02B 6/42    (2006.01)
G02B 6/43    (2006.01)
G02B 6/36    (2006.01)

(52) U.S. Cl.
CPC ............ *G02B 6/4249* (2013.01); *G02B 6/425* (2013.01); *G02B 6/4293* (2013.01); *G02B 6/43* (2013.01); *G02B 6/12* (2013.01); *G02B 6/12019* (2013.01)
USPC ................................ 385/14; 385/38; 385/88

(58) Field of Classification Search
CPC ........ G02B 6/12; G02B 6/12019; G02B 6/43; G02B 6/4293; G02B 6/4249; G02B 6/425
USPC ........................................................ 385/38
See application file for complete search history.

(56) References Cited

U.S. PATENT DOCUMENTS

| 4,758,063 | A | * | 7/1988 | Konechny, Jr. ................. 385/53 |
| 4,949,224 | A | * | 8/1990 | Yamamura et al. ........... 361/784 |
| 5,001,542 | A | * | 3/1991 | Tsukagoshi et al. .......... 257/746 |
| 5,071,223 | A | * | 12/1991 | Gotoh et al. .................... 385/14 |
| 5,186,383 | A | * | 2/1993 | Melton et al. ............ 228/180.22 |
| 5,249,245 | A | * | 9/1993 | Lebby et al. .................... 385/89 |
| 5,271,083 | A | * | 12/1993 | Lebby et al. .................. 385/130 |
| 5,446,814 | A | * | 8/1995 | Kuo et al. ....................... 385/31 |
| 5,597,110 | A | * | 1/1997 | Melton et al. ................. 228/203 |

(Continued)

FOREIGN PATENT DOCUMENTS

| JP | 2003-114365 | 4/2003 |
| JP | 2006-053473 | 2/2006 |

*Primary Examiner* — Rhonda Peace
(74) *Attorney, Agent, or Firm* — Lowe Hauptman & Ham, LLP (57) ABSTRACT

There is provided a photoelectric conversion module in which an optical device and an optical waveguide are arrayed in a horizontal direction, thereby improving the optical coupling efficiency and therefore, reducing light loss. To this end, the present invention provides a photoelectric conversion module comprising: a printed circuit board; an integrated circuit board mounted on the printed circuit board, wherein an optical waveguide array is positioned within the integrated circuit board so as to pass from one side to the other side of the integrated circuit board, and first and second electrode pads are positioned at one sidewall of the integrated circuit board; an optical device array wherein first and second electrode bumps to be respectively connected to the first and second electrode pads are positioned at one sidewall of the optical device array facing the integrated circuit board and an optical device is positioned in a middle part of the optical device array; and a semiconductor chip mounted on the is integrated circuit board.

6 Claims, 6 Drawing Sheets

(56) References Cited

U.S. PATENT DOCUMENTS

| | | | |
|---|---|---|---|
| 5,625,734 A * | 4/1997 | Thomas et al. | 385/88 |
| 6,215,585 B1 * | 4/2001 | Yoshimura et al. | 359/344 |
| 6,517,259 B1 * | 2/2003 | Murata | 385/92 |
| 6,960,031 B2 * | 11/2005 | McFarland et al. | 385/89 |
| 7,046,871 B2 * | 5/2006 | Shen | 385/14 |
| 7,101,091 B2 * | 9/2006 | Golwalkar et al. | 385/89 |
| 7,251,391 B2 * | 7/2007 | Murayama | 385/15 |
| 7,295,725 B1 * | 11/2007 | Wu et al. | 385/14 |
| 7,336,864 B2 * | 2/2008 | Dellmann et al. | 385/14 |
| 7,364,369 B2 * | 4/2008 | Sakurai et al. | 385/89 |
| 7,403,676 B2 * | 7/2008 | Kurihara et al. | 385/14 |
| 7,441,964 B2 * | 10/2008 | Hamasaki et al. | 385/89 |
| 7,476,037 B2 * | 1/2009 | Golwalkar et al. | 385/89 |
| 7,618,200 B2 * | 11/2009 | Sakurai et al. | 385/89 |
| 7,724,988 B2 * | 5/2010 | Dellmann et al. | 385/14 |
| 7,775,727 B2 * | 8/2010 | Hamasaki et al. | 385/94 |
| 2002/0015562 A1 * | 2/2002 | Kikuchi et al. | 385/47 |
| 2002/0114587 A1 * | 8/2002 | Golwalkar et al. | 385/88 |
| 2003/0053765 A1 * | 3/2003 | Oda et al. | 385/88 |
| 2005/0169596 A1 * | 8/2005 | Hamasaki et al. | 385/137 |
| 2005/0169639 A1 * | 8/2005 | Shen | 398/164 |
| 2006/0018590 A1 * | 1/2006 | Murayama | 385/15 |
| 2007/0053637 A1 * | 3/2007 | Golwalkar et al. | 385/88 |
| 2007/0081769 A1 * | 4/2007 | Hamasaki et al. | 385/89 |
| 2007/0086695 A1 * | 4/2007 | Hsu | 385/14 |
| 2007/0165986 A1 | 7/2007 | Sakurai et al. | |
| 2007/0212001 A1 * | 9/2007 | Sakurai et al. | 385/88 |
| 2008/0240648 A1 | 10/2008 | Im | |
| 2008/0298745 A1 * | 12/2008 | Hamasaki et al. | 385/39 |
| 2009/0080830 A1 | 3/2009 | Matsuoka et al. | |
| 2009/0154870 A1 | 6/2009 | Watanabe et al. | |
| 2010/0272388 A1 * | 10/2010 | Im et al. | 385/14 |

* cited by examiner

PHOTOELECTRIC CONVERSION MODULE

CROSS-REFERENCE TO RELATED APPLICATION

This application claims the benefit of Korean Patent Application No. 10-2009-0035363, filed Apr. 23, 2009, and No. 10-2009-0056421 filed Jun. 24, 2009, the disclosure of which is hereby incorporated herein by reference in its entirety.

BACKGROUND OF THE INVENTION

1. Field of the Invention

The present invention relates to a photoelectric conversion module, and more particularly, to a photoelectric conversion module which improves the optical coupling efficiency.

2. Description of the Related Art

In the present information and communication technologies, optical communication technologies are developed to achieve high speed communication environments according to high speed and high capacity data transmission. In the optical communication, a photoelectric conversion device of a sender converts an electric signal into an optical signal, and the converted optical signal is transmitted to a receiver by an optical fiber or an optical waveguide. A photoelectric conversion device of the receiver converts the received optical signal into the electric signal. For the system application and commercialization of these photoelectric conversion devices, the photoelectric conversion devices need to be structured to efficiently achieve the electrical connection and optical coupling.

Figure 1:
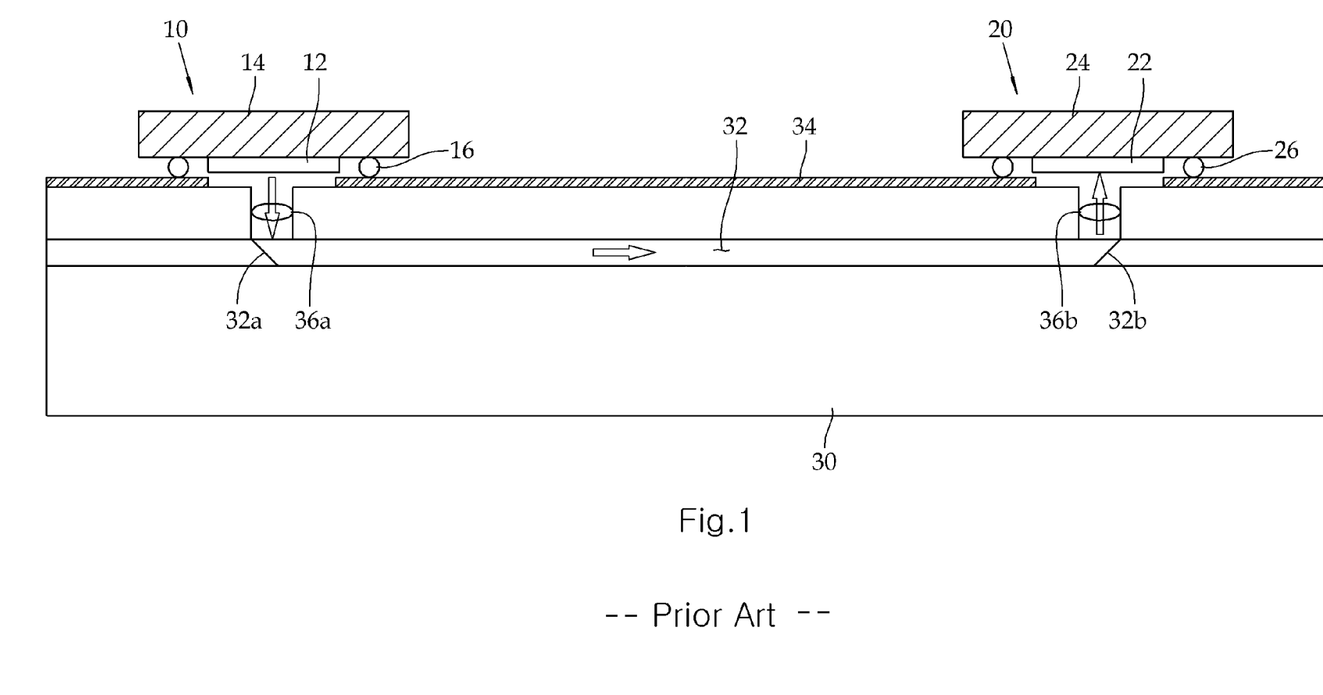
FIG. 1 is a sectional view illustrating a conventional photoelectric conversion module.

FIG. 1 is a sectional view illustrating a conventional photoelectric conversion module.

As illustrated in FIG. 1, the conventional photoelectric conversion module comprises: a photoelectric conversion device 10 of a sender and a photoelectric conversion device 20 of a receiver, which are positioned on a printed circuit board (PCB) 30.

The photoelectric conversion device 10 of the sender comprises: a first optical device 12 emitting light to one side of an optical waveguide 32 positioned in the printed circuit board 30, and a first semiconductor chip 14 controlling the first optical device 12. The photoelectric conversion device 20 of a receiver comprises: a second optical device 22 receiving an optical signal transmitted through the optical waveguide 32, and a second semiconductor chip 24 controlling the second optical device 22.

The first and second optical devices 12 and 22 are respectively bonded to lower parts of the first and second semiconductor chips 14 and 24. Further, the first and second optical devices 12 and 22 are respectively positioned to correspond to ends of the optical waveguide 32.

Through connection bumps 16 and 26, the first and second semiconductor chips 14 and 24 are respectively connected to a signal line 34 positioned on the printed circuit board 30, to be electrically connected to the printed circuit board 30.

The driving characteristics of the conventional photoelectric conversion module in the above-described structure will be described below:

The first optical device 12 converts an electric signal into an optical signal, based on the control of the first semiconductor chip 14 of the photoelectric conversion device 10 of the sender. The optical signal converted by the first optical device 12 is reflected through a first micro mirror 32a and is transmitted into the optical waveguide 32. The first micro mirror 32a is positioned at the end of the optical waveguide 32 on the part of the sender. The optical signal transmitted into the optical waveguide 32 is reflected through a second micro mirror 32b and is input into the second optical device 22 of the photoelectric conversion device 20 of the receiver. The second micro mirror 32b is positioned at the end of the optical waveguide 32 on the part of the receiver. The second optical device 22 receives the optical signal transmitted through the optical waveguide 32, converts the optical signal into the electric signal and outputs the electric signal, based on the control of the second semiconductor chip 24.

In the conventional photoelectric conversion module, since the first and second optical devices 12 and 22 are positioned to be spaced apart from each other perpendicularly to the direction in which the optical waveguide 32 extends, the optical coupling efficiency is decreased. In general, a vertical cavity surface emitting laser (VCSEL) is used as the first optical device 12. When the vertical cavity surface emitting laser emits light in the air, its emission angle is about 25~30 degrees. Therefore, as the distance between the vertical cavity surface emitting laser and the optical waveguide 32 becomes greater, the optical coupling efficiency is considerably decreased.

As a part to solve the problem in that the optical coupling efficiency is decreased, the conventional photoelectric conversion module has presented a scheme to improve the optical coupling efficiency by positioning lenses 36a and 36b between the first and second optical devices 12 and 22 and the optical waveguide 32. Since the lenses 36a and 36b prevent the light emitted from the vertical cavity surface emitting laser from spreading, the optical coupling efficiency could be improved. However, since the number of the lenses 36a and 36b to be positioned is increased according to the distance between the first and second optical devices 12 and 22 and the optical waveguide 32, there are the problems in that an additional process is needed to position the lenses 36a and 36b between the first and second optical devices 12 and 22 and the optical waveguide 32 and this additional process becomes an obstacle in mass production.

Further, in the conventional photoelectric conversion module, the micro mirrors 36a and 36b respectively sloping at specific angles are positioned in the ends of both sides of the optical waveguide 32, to reflect the light emitted from the first optical device 12 so as to be directed into the optical waveguide 32 and to reflect the light transmitted through the optical waveguide 32 so as to be directed to the second optical device 22. However, processes with many steps are required to manufacture the micro mirrors 36a and 36b in a metal thin film having a thickness of about several tens of microns, to position the micro mirrors 36a and 36b so as to slope at specific angles, and to align the micro mirrors 36a and 36b with an optical axis at accurate positions during the process of manufacturing the photoelectric conversion module. Moreover, the reliability of the photoelectric conversion module is greatly decreased during this process.

As described above, in the conventional photoelectric conversion module, since the optical coupling efficiency is decreased by the vertical distance between the optical devices and the optical waveguide, light loss is caused when light is emitted or received. Moreover, since the micro mirrors, lenses and the like are additionally formed or positioned to solve the problem in that the optical coupling efficiency is decreased, the process of manufacturing the photoelectric conversion module becomes complicated. Moreover, since the devices, such as the micro mirrors, are manufactured in a micro-miniature structure, in fact, not only it is difficult to match the devices with the optical axis but also the devices are easily damaged during the manufacturing process. Consequently, both process and production costs increase.

SUMMARY OF THE INVENTION

Therefore, it is an object of the present invention to provide a photoelectric conversion module in which an optical device and an optical waveguide are aligned in a horizontal direction, thereby increasing the optical coupling efficiency and thus decreasing light loss.

It is another object of the present invention to provide a photoelectric conversion module in which an electric circuit device and an optical circuit device are independently separated from each other and positioned on a printed circuit board, thereby independently replacing the electric circuit device or the optical circuit device when it malfunctions and therefore simplifying repairs.

It is another object of the present invention to provide a photoelectric conversion module in which the number of constituent elements of the photoelectric conversion module is decreased, compared with that of the conventional photoelectric conversion module, thereby enabling mass production and decreasing the manufacturing cost.

In accordance with an aspect of the present invention, there is provided a photoelectric conversion module comprising: a printed circuit board; an integrated circuit board mounted on the printed circuit board, wherein an optical waveguide array is positioned in the integrated circuit board so as to pass from one side to the other side of the integrated circuit board and first and second electrode pads are positioned at one sidewall of the integrated circuit board; an optical device array wherein first and second electrode bumps to be respectively connected to the first and second electrode pads are positioned at one sidewall of the optical device array facing the integrated circuit board and an optical device is positioned in a middle part of the optical device array; and a semiconductor chip mounted on the integrated circuit board.

In accordance with another aspect of the present invention, there is provided a photoelectric conversion module comprising: a printed circuit board; a bare board mounted on the printed circuit board, wherein an optical waveguide array is positioned in the bare board so as to pass from one side to the other side of the bare board and first and second electrode pads are positioned at one sidewall of the bare board; an optical device array wherein first and second electrode bumps to be respectively connected to the first and second electrode pads are positioned at one sidewall of the optical device array facing the bare board and an optical device is positioned in a middle part of the optical device array; and a semiconductor chip mounted on the printed circuit board.

BRIEF DESCRIPTION OF THE DRAWINGS

The above and other features and advantages of the present invention will become more apparent to those of ordinary skill in the art by describing in detail preferred embodiments thereof with reference to the attached drawings in which.

BRIEF DESCRIPTION OF REFERENCE NUMBERS OF MAJOR ELEMENTS 120, 220a, 220b, 320a, 320b, 420, 520, 620, 720: optical device array
110, 210, 310a, 310b, 630: integrated circuit board
410, 510, 610, 710: bare board
111, 211, 311, 411, 511, 611, 711: optical waveguide array
100, 200, 300, 400, 500, 600, 700: printed circuit board
140, 240a, 240b, 340a, 340b, 440, 540, 640, 740: semiconductor chip
129, 229, 329a, 329b, 402, 429, 542, 529, 602, 629, 702, 729: signal line
122, 222a, 222b, 322a, 322b, 422, 522, 622, 712: optical device
114a, 114b, 214a, 214b, 214c, 214d, 314a, 341b, 314c, 314d, 414a, 414b, 514a, 514b, 614a, 614b, 714a, 714b: electrode pad
121a, 121b, 221a, 221b, 221c, 221d, 321a, 321b, 321c, 321d, 401c, 519, 619, 701c: electrode bump
101, 141, 201, 241, 301a, 301b, 341a, 341b, 341c, 341d, 401a, 401b, 601a, 601b, 701a: connection bump
701b: connection pin

DETAILED DESCRIPTION OF THE PREFERRED EMBODIMENT

The present invention will now be described more fully hereinafter with reference to the accompanying drawings, in which preferred embodiments of the invention are shown, so that those of ordinary skill in the art can easily carry out the technical idea of the present invention.

In drawings, the thickness, width, size and the like of each element may be exaggerated for clarity.

Further, when an element is referred to as a "connection bump" or "electrode bump", it can be interpreted in a meaning that it includes an ordinary solder ball.

As used herein, the singular forms, "a", "an" and "the", are intended to include the plural forms as well, unless the context clearly indicates otherwise.

Like numbers refer to like elements having like functions and actions throughout the specification and drawings.

Embodiment 1

Figure 2:
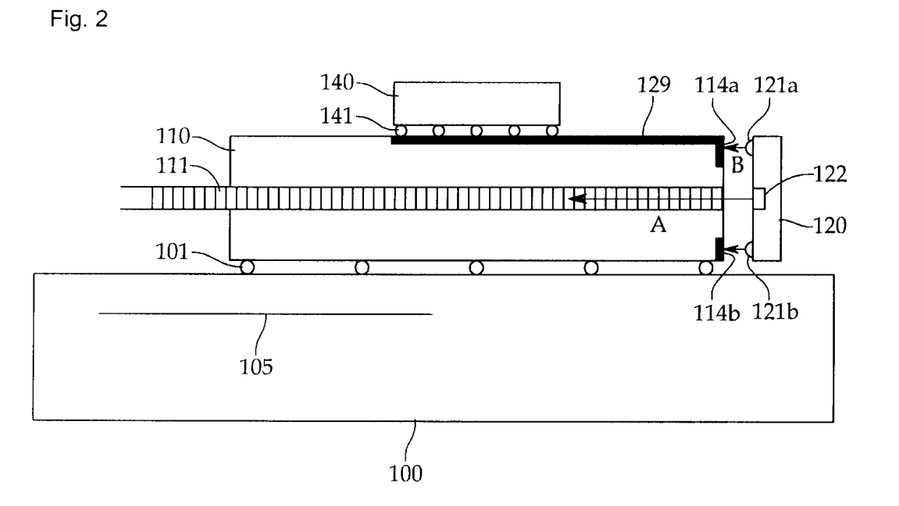
FIG. 2 is a sectional view illustrating a photoelectric conversion module according to a first embodiment of the present invention.

FIG. 2 is a sectional view illustrating a photoelectric conversion module is according to a first embodiment of the present invention.

As illustrated in FIG. 2, the photoelectric conversion module according to the first embodiment of the present invention comprises: a printed circuit board 100, an integrated circuit (IC) board 110 mounted on the printed circuit board 100 and including an optical waveguide array 111 inside, a semiconductor chip 140 mounted on the integrated circuit board 110, and an optical device array 120 positioned horizontally with the optical waveguide array 111.

The integrated circuit board 110 is electrically connected to the printed circuit board 100 by a flip chip bonding method using a first connection bump 101. The optical waveguide array 111 positioned in the integrated circuit board 110 is to transmit an optical signal provided from the optical device array 120.

Figure 3:
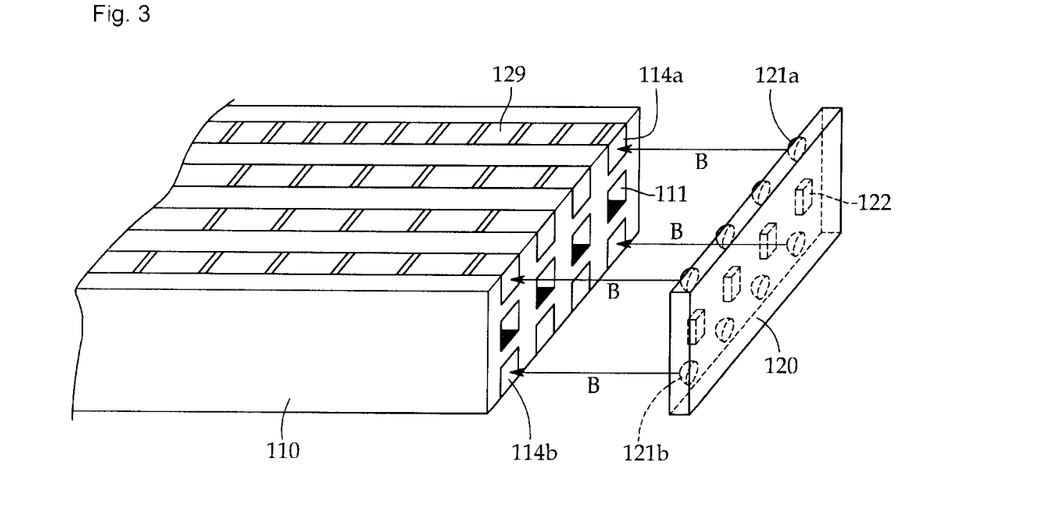
FIG. 3 is a perspective view illustrating an integrated circuit board and an optical device array as shown in FIG. 2.

FIG. 3 is a perspective view illustrating the integrated circuit board 110 and the optical device array 120, to more specifically describe an optical coupling structure according to the present invention.

As illustrated in FIG. 3, a first electrode pad 114a and a second electrode pad 114b are positioned at one sidewall of the integrated circuit board 110 facing the optical device array 120. The first electrode pad 114a is positioned above the optical waveguide array 111 and the second electrode pad 114b is positioned below the optical wave guide array 111. Further, a signal line 129 is formed on the integrated circuit board 110. The signal line 129 receives/transmits an electric signal from/to the semiconductor chip 140. The signal line 129 and the first electrode pad 114 are formed together in a single unit or the signal line 129 is electrically connected to the first electrode pad 114. The second electrode pad 114b is connected to a ground line (not shown) within the integrated circuit board 110.

The optical device array 120 comprises: a first electrode bump 121a to be connected to the first electrode pad 114a of the integrated circuit board 110, a second electrode bump 121b to be connected to the second electrode pad 114b of the integrated circuit board 110, and an optical device 122 (a light emitting unit or light receiving unit) to be optically connected to the optical waveguide array 111.

When the integrated circuit board 110 is manufactured, the optical device array 120 in a predetermined size is provided. Therefore, the first and second electrode pads 114a and 114b and the optical waveguide array 111 need to be positioned in the integrated circuit board 110 so as to correspond to the sizes and positions of the first and second electrode bumps 121a and 121b and the optical device 122 positioned in the optical device array 120, thereby relatively easily and efficiently achieving the optical coupling between the optical waveguide array 111 and the optical device 122.

Figure 4:
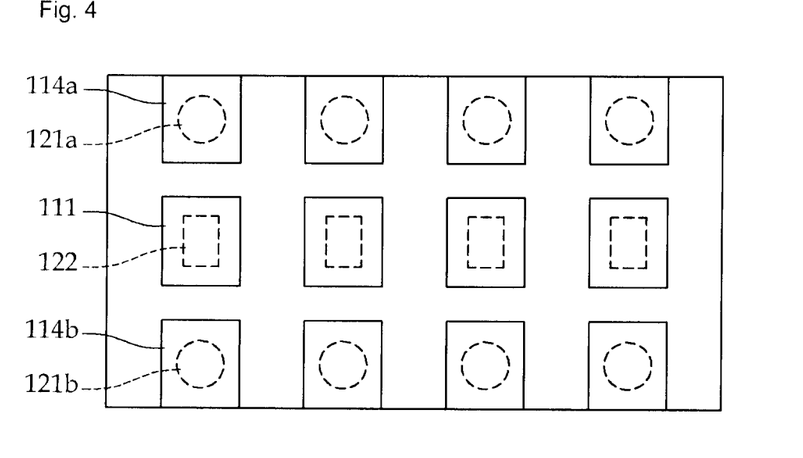
FIG. 4 is a side view illustrating the integrated circuit board after it is connected to the optical device array as shown in FIG. 2.

FIG. 4 is a side view illustrating the optical device array 120 connected to the integrated circuit board 110.

As illustrated in FIG. 4, the first and second electrode pads 114a and 114b of the integrated circuit board 110 are aligned with the first and second electrode bumps 121a and 121b of the optical device array 120, and the optical waveguide array 111 is aligned with the optical device 122. Accordingly, the optical coupling between the optical waveguide array 111 and the optical device 122 is efficiently achieved by simply connecting the integrated circuit board 110 and the optical device array 120 together in the direction of an arrow B illustrated in FIG. 3.

Preferably, the sizes of the first and second electrode pads 114a and 114b positioned at the one sidewall of the integrated circuit board 110 may be greater than the sizes of the first and second electrode burns 121a and 121b of the optical device array 120, thereby adjusting the position of the optical device array 120 within a predetermined range, to secure the position matching margin between the optical waveguide array 111 and the optical device 112. The first and second electrode pads 114a and 114b may use various metals, such as copper (Cu), aluminum (Al), gold (Au) and others. Further, the first and second electrode pads 114a and 114b may be coated with a coating film using various materials, such as nickel (Ni), gold (Au), tin (Sn), silver (Ag) and others, to improve the performance of bonding to the optical device array 120.

In FIG. 2, the integrated circuit board 110 is electrically connected to an upper part of the printed circuit board 100 by the flip chip bonding method through the first connection bump 101. The integrated circuit board 110 is used as a medium to make the semiconductor chip 140 to be easily electrically connected to the printed circuit board 100.

In the semiconductor chip 140, there are a number of electrodes and the interval between the electrodes is only several tens of microns. Therefore, to directly connect the semiconductor chip 140 to the printed circuit board 100, the structure of the printed circuit board 100 is complicated and the cost is greatly increased. Accordingly, the semiconductor chip 140 is not directly mounted on the printed circuit board 100 but is mounted on the integrated circuit board 110. That is, the integrated circuit board 110 is used as the electrical connection medium between the semiconductor chip 140 and the printed circuit board 100, thereby electrically connecting the semiconductor chip 140 and the printed circuit board 100.

As described, the semiconductor chip 140 including a drive circuit to drive the optical device array 120 is mounted on the integrated circuit board 110. The semiconductor chip 140 is electrically connected to the integrated circuit board 110 through a second connection bump 141 and the signal line 129. Further, a resin material may be filled between the semiconductor chip 140 and the integrated circuit board 110, to relieve the thermal stress between the integrated circuit board 110 and the semiconductor chip 140.

Further, although it is not illustrated in the drawing, if needed, a given resin material may be filled between the printed circuit board 100 and the integrated circuit board 110, to relieve the stress occurring by differences in the coefficient of thermal expansion among the devices (components) when an external temperature changes.

Further, optically transparent epoxy may be filled between the integrated circuit board 110 and the optical device array 120, to increase the optical coupling efficiency. The optically transparent epoxy has a similar refractive index to an optical waveguide of the optical waveguide array 111. It is preferable to use polymer epoxy having good optical transparency in a use wavelength of the optical device array 120. For example, the optically transparent epoxy has preferably a refractive index of 1.4~1.6 and an optical transmission of 80~95% in the wavelength of light emitted in the optical device array 120.

However, the optical coupling between the optical device array 120 and the optical waveguide array 111 are not necessarily achieved by the optically transparent epoxy. The optical device array 120 and the optical waveguide array 111 can be coupled by an ordinary packaging technique using an auxiliary sleeve or the like unless the optical coupling efficiency is significantly decreased.

In FIGS. 2 and 3, the optical device array 120 may use any one optical device selected from a group of the vertical cavity surface emitting laser (VCSEL), light emitting diode (LED) and photo diode.

Further, the optical waveguide array 111 may be formed preferably as a silica optical waveguide or polymer optical waveguide. However, the present invention does not limit the material of the optical waveguide array 111 to the aforementioned materials. The optical waveguide array 111 may be formed using any material if it is transparent, like glass, in addition to silica and polymer.

The photoelectric conversion module in the above-described structure according to the first embodiment of the present invention has the following driving characteristics:

A signal transmitted through an electrical wiring 105 formed inside the printed circuit board 100 passes through the integrated circuit board 110 and is transmitted to the drive circuit of the semiconductor chip 140. The electric signal of the drive circuit is transmitted to the optical device 122 of the optical device array 120 through the second connection bump 141 and the signal line 129. The optical device 122 (when it is the light emitting unit) converts the electric signal into an optical signal and transmits the optical signal to the optical waveguide array 111. The optical signal transmitted to the optical waveguide array 111 is transmitted, along the optical waveguide array 111, in the direction of an arrow A illustrated in FIG. 2.

Embodiment 2

Figure 5:
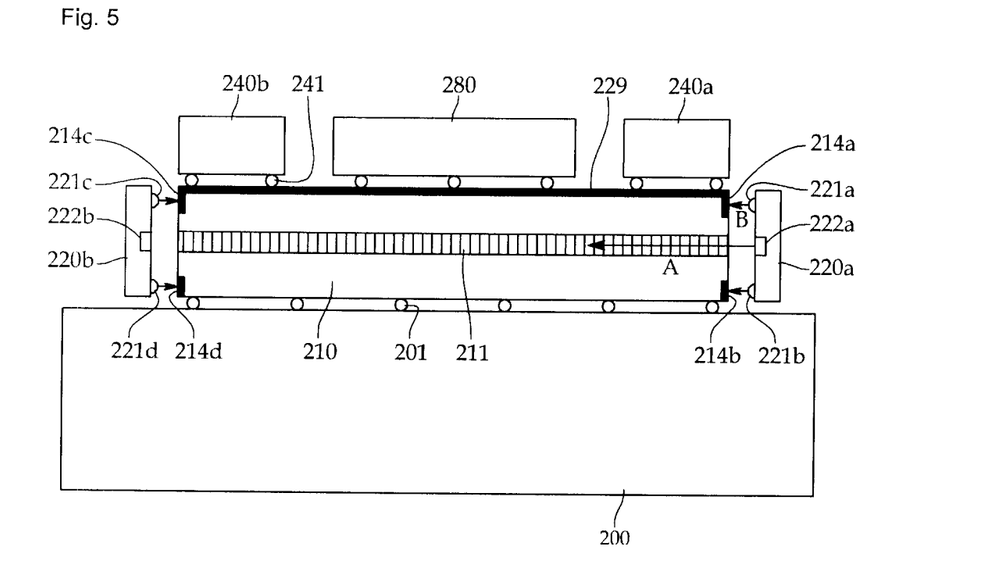
FIG. 5 is a sectional view illustrating a photoelectric conversion module according to a second embodiment of the present invention.

FIG. 5 is a sectional view illustrating a photoelectric conversion module according to a second embodiment of the present invention.

As illustrated in FIG. 5, the photoelectric conversion module according to the second embodiment of the present invention has a similar structure to the photoelectric conversion module according to the first embodiment of the present invention illustrated in FIG. 2, except for a first optical device array 220a and a second optical device array 220b connected to both sides of an integrated circuit board 210.

In the photoelectric conversion module according to the second embodiment of the present invention, the integrated circuit board 210 is bonded on a printed circuit board 200, by a flip chip bonding method through a first connection bump 201. A signal line 229 is formed on the integrated circuit board 210, to transmit electric signals from a first semiconductor chip 240a and a second semiconductor chip 240b. A first electrode pad 214a connected to the signal line 229 is positioned at an upper side of the integrated circuit board 210. Further, an optical waveguide array 211 is positioned in the integrated circuit board 210. A second electrode pad 214b connected to a ground line formed in the integrated circuit board 210 is positioned at a lower side of the integrated circuit board 210.

The first optical device array 220a comprises: a first electrode bump 221a connected to the first electrode pad 214a of the integrated circuit board 210, a second electrode bump 221b connected to the second electrode pad 214b of the integrated circuit board 210, and a light emitting unit 222a optically connected, in a horizontal direction, to the optical waveguide array 211 (or a single optical waveguide) which passes through the integrated circuit board 210 and is positioned in the integrated circuit board 210.

The second optical device array 220b comprises: a third electrode bump 221c connected to a third electrode pad 214c of the integrated circuit board 210, a fourth electrode bump 221d connected to a fourth electrode pad 214d of the integrated circuit board 210, and a light receiving unit 222b optically connected, in the horizontal direction, to the optical waveguide array 211 (or a single optical waveguide) which passes through the integrated circuit board 210 and is positioned in the integrated circuit board 210.

In the photoelectric conversion module according to the second embodiment of the present invention, since the first and second optical device arrays 220a and 220b are provided in the same predetermined size, the first, second, third and fourth electrode pads 214a, 214b, 214c and 214d and the optical waveguide array 211 need to be positioned in the integrated circuit board 110 so as to correspond to the sizes and positions of the first, second, third and fourth electrode burns 221a, 221b, 221c and 221d, the light emitting unit 222a and the light receiving unit 222b positioned in the first and second optical device arrays 220a and 220b.

Since the first, second, third and fourth electrode pads 214a, 214b, 214c and 214d and the optical waveguide array 211 are positioned so as to correspond to the sizes and positions of the first, second, third and fourth electrode burns 221a, 221b, 221c and 221d, the light emitting unit 222a and the light receiving unit 222b of the first and second optical device arrays 220a and 220b, the optical coupling among the optical waveguide array 211, the light emitting unit 222a and the light receiving unit 222b is efficiently achieved by simply connecting the first, second, third and fourth electrode pads 214a, 214b, 214c and 214d of the integrated circuit board 210 to the first, second, third and fourth electrode bumps 221a, 221b, 221c and 221d.

The photoelectric conversion module in the above-described structure according to the second embodiment of the present invention has the following driving characteristics:

An electric signal in a large-scale integration (LSI) 280 is transmitted to the first semiconductor chip 240a through the signal line 229 of the integrated circuit board 210. The first semiconductor chip 240a generates a new electric signal in response to the input electric signal and transmits the new electric signal to the first optical device array 220a. The light emitting unit 222a of the first optical device array 220a converts the electric signal into an optical signal and transmits the optical signal in the direction of an arrow A, through the optical waveguide array 211. The optical signal transmitted from the first optical device array 220a through the optical waveguide array 211 is transmitted to the light receiving unit 222b of the second optical device array 220b positioned opposite to the first optical device array 220a. The light receiving unit 222b of the second optical device array 220b converts the received optical signal into an electric signal and transmits the electrical signal to the second semiconductor chip 240b through the signal line 229. The second semiconductor chip 240b amplifies the electric signal and transmits it to the large-scale integration 280.

Embodiment 3

Figure 6:
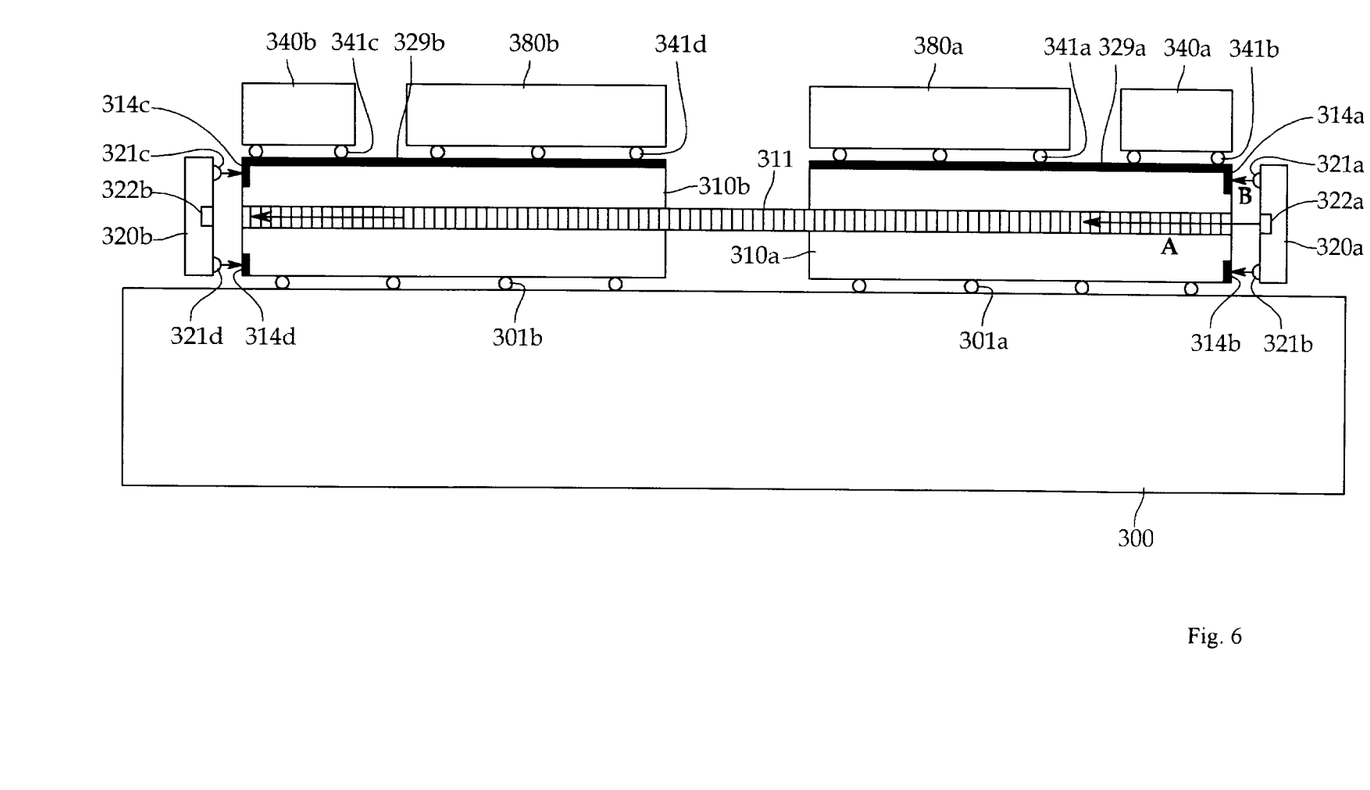
FIG. 6 is a sectional view illustrating a photoelectric conversion module according to a third embodiment of the present invention.

FIG. 6 is a sectional view illustrating a photoelectric conversion module according to a third embodiment of the present invention.

Referring to FIG. 6, the photoelectric conversion module according to the third embodiment of the present invention has a similar structure to the photoelectric conversion module according to the second embodiment of the present invention, except that a first integrated circuit board 310a and a second integrated circuit board 310b are mounted on a printed circuit board 300, and a first optical device array 320a and a second optical device array 320b are respectively positioned at sides of the first and second integrated circuit boards 310a and 310b facing each other.

As illustrated in FIG. 6, the first and second integrated circuit boards 310a and 310b are positioned on the printed circuit board 300 so as to be spaced apart from each other. The first and second integrated circuit boards 310a and 310b are connected to each other by an optical waveguide array 311 extending to be positioned in the first and second integrated circuit boards 310a and 310b.

In the first integrated circuit board 310a, a first signal line 329a is positioned on the first integrated circuit board 310a, to transmit an electric signal of a first semiconductor chip 340a, and a first electrode pad 314a connected to the first signal line 329a is positioned at an upper side of the integrated circuit board 310a. The optical waveguide array 311 is positioned within the first integrated circuit board 310a. The optical waveguide array 311 extends into the second integrated circuit board 310b. A second electrode pad 314b is positioned at a lower side of the integrated circuit board 310a. The second electrode pad 314b is connected to a ground line (not shown) positioned within the first integrated circuit board 310a.

In the same manner as in the first integrated circuit board 310a, a second signal line 329b, a third electrode pad 314c and a fourth electrode pad 314d are positioned in the second integrated circuit board 310b. The second signal line 329b is positioned on the second integrated circuit board 310b, and the third and fourth electrode pads 314c and 314d are positioned at one sidewall of the second integrated circuit board 310b.

The first optical device array 320a is positioned at a side of the first integrated circuit board 310a. A first electrode bump 321a and a second electrode bump 321b to be respectively connected to the first and second electrode pads 314a and 314b of the first integrated circuit board 310a are positioned at one sidewall of the first optical device array 320a. Further, a light emitting unit 322a to be connected to the optical waveguide array 311 is positioned in the first optical device array 320a.

The second optical device array 320b is positioned at a side of the second integrated circuit board 310b. A first electrode bump 321a and a second to electrode bump 321b to be respectively connected to the third and fourth electrode pads 314c and 314d of the second integrated circuit board 310b are positioned at one sidewall of the second optical device array 320b. Further, a light receiving unit 322b to be connected to the optical waveguide array 311 is positioned in the second optical device array 320b.

In the photoelectric conversion module according to the third embodiment of the present invention, the first and second optical device arrays 320a and 320b are provided in the same predetermined size. Thus, the first, second, third and fourth electrode pads 314a, 314b, 314c and 314d and the optical waveguide array 311 need to be positioned in the first and second integrated circuit boards 310a and 310b so as to correspond to the sizes and positions of the first, second, third and fourth electrode burns 321a, 321b, 321c and 321d, the light emitting unit 322a and the light receiving unit 322b positioned in the first and second optical device arrays 320a and 320b. Therefore, the optical waveguide array 311 is stably connected to the light emitting unit 322a and the light receiving unit 322b simply with the work of connecting the first, second, third and fourth electrode burns 321a, 321b, 321c and 321d to the first, second, third and fourth electrode pads 314a, 314b, 314c and 314d, so that the optical coupling is efficiently achieved.

The photoelectric conversion module in the above-described structure according to the third embodiment of the present invention has the following driving characteristics:

An electric signal being output from a first large-scale integration 380a is transmitted to the first semiconductor chip 340a through a first connection burn 341a and the first signal line 329a. The first semiconductor chip 340a generates a new electric signal in response to the input electric signal, and the generated electric signal is transmitted to the light emitting unit 322a of the first optical device array 320a through a second connection bump 341b, the first signal line 329a, the first electrode pad 314a and the first electrode bump 321a.

The light emitting unit 322a converts the input electric signal into an optical signal and transmits the optical signal to the optical waveguide array 311.

The optical signal provided from the light emitting unit 322a to the optical waveguide array 311 is transmitted to the light receiving unit 322b of the second optical device array 320b in the direction of an arrow A. The light receiving unit 322b converts the transmitted optical signal into an electric signal, and the converted electric signal is transmitted to the second semiconductor chip 340b through the third electrode bump 321c, the third electrode pad 314c, the second signal line 329b and a third connection bump 341c. The second semiconductor chip 340b amplifies the input electric signal and transmits the amplified electric signal to a second large-scale integration 380b through the third connection bump 341c, the second signal line 329b and a fourth connection bump 341d.

Embodiment 4

Figure 7:
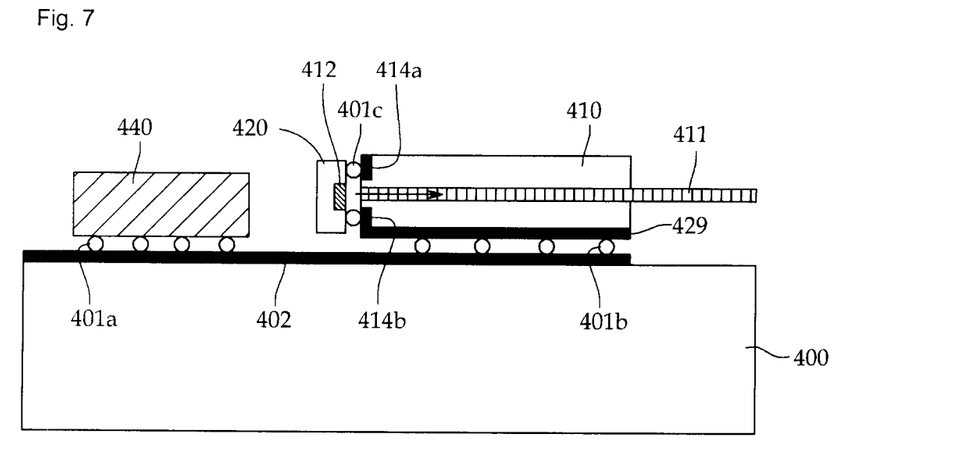
FIG. 7 is a sectional view illustrating a photoelectric conversion module according to a fourth embodiment of the present invention.

FIG. 7 is a sectional view illustrating a photoelectric conversion module according to a fourth embodiment of the present invention.

Referring to FIG. 7, the photoelectric conversion module according to the fourth embodiment of the present invention is similar to the photoelectric conversion modules according to the first, second and third embodiments of the present invention with respect to the structure and method of aligning an optical device array and an optical waveguide array. But, unlike the photoelectric conversion modules according to the first, second and third embodiments in which the optical waveguide array is positioned within the integrated circuit board, the photoelectric conversion module according to the fourth embodiment has a different structure in which an optical waveguide array is positioned within a bare board forming no integrated circuit.

As illustrated in FIG. 7, the photoelectric conversion module according to the fourth embodiment comprises: a bare board 410 mounted on a printed circuit board 400, an optical device array 420 optically connected horizontally with the direction in which light is transmitted in an optical waveguide array 411 positioned within the bare board 410, and a semiconductor chip 440 mounted on the printed circuit board 400 and positioned horizontally with the bare board 410.

As described above, in the photoelectric conversion module according to the fourth embodiment, the optical waveguide array is positioned in the bare board, instead of in an integrated circuit board. This is because there are many restrictions in processes to form an optical waveguide array in an integrated circuit board with integrate circuits formed in different shapes. Therefore, in the fourth embodiment of the present invention, the process is simplified by realizing the optical waveguide array 411 in the bare board 410, instead of in the integrated circuit board.

The bare board 410 and the semiconductor chip 440 are respectively mounted on the printed circuit board 400 by a flip chip bonding method. The semiconductor chip 440 is connected to a first signal line 402 positioned on the printed circuit board 400 through a first connection bump 401a. A second signal line 429 is positioned under the bare board 410 and is connected to the first signal line 402 through a second connection bump 401b.

The bare board 410 is a pure board in which no integrated circuit is formed. The bare board 410 is composed of a material having dielectric properties. For example, the bare board 410 may be formed of ceramics or semiconductor materials in which impurities are not doped. The optical waveguide array 411 is positioned within the bare board 410, and a first electrode pad 414a and a second electrode pad 414b are positioned on one sidewall of the bare board 410. The optical waveguide array 411 is positioned between the first electrode pad 414a and the second electrode pad 414b.

Preferably, the optical waveguide array 411 may be formed as a silica optical waveguide or polymer optical waveguide. However, the present invention does not limit the material of the optical waveguide array to the aforementioned materials. The optical waveguide array may be formed using any material if it is a transparent material, like glass, which has a required refractive index and is capable of transmitting light. Further, a sectional shape of an optical waveguide is not limited to a square. It may have a circular shape or any one of various shapes.

The optical device array 420 is connected to each of the first and second electrode pads 414a and 414b of the bare board 410 through first and second electrode bumps 401c. The optical device array 420 comprises an optical device (a light emitting unit or a light receiving unit) 412 optically connected to the optical waveguide array 411 in the horizontal direction.

The photoelectric conversion module in the above-described structure according to the fourth embodiment of the present invention as illustrated in FIG. 7 has the following driving characteristics:

An electric signal being output from the semiconductor chip 440 including a drive circuit to drive the optical device array 420 is transmitted to the first signal line 402 on the printed circuit board 400 through the first connection bump 401a. The electric signal transmitted to the first signal line 402 is transmitted to the second signal line 429 of the bare board 410 through the second connection bump 401b. The electric signal transmitted to the second signal line 429 passes through the second electrode pad 414b and the second electrode bump 401c and is transmitted to the optical device array 420. The optical device array 420 converts the input electric signal into an optical signal and emits light through the optical device 412 (when it is the light emitting unit). The optical signal emitted through the optical device 412 is transmitted through the optical waveguide array 411 in the direction of an arrow as shown.

Embodiment 5

Figure 8:
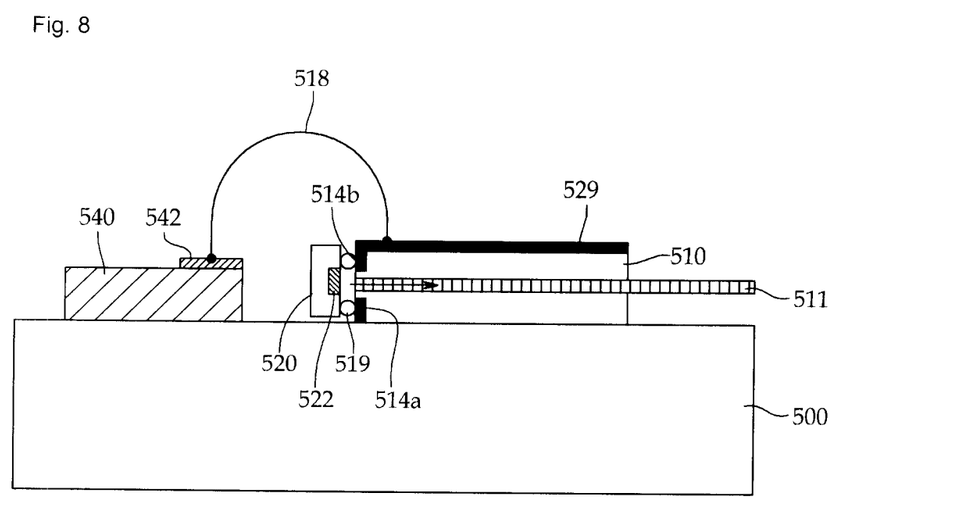
FIG. 8 is a sectional view illustrating a photoelectric conversion module according to a fifth embodiment of the present invention.

FIG. 8 is a sectional view illustrating a photoelectric conversion module according to a fifth embodiment of the present invention.

Referring to FIG. 8, like the photoelectric conversion module according to the fourth embodiment of the present invention, in the photoelectric conversion module according to the fifth embodiment of the present invention, an electric circuit device and an optical circuit device are independently and separately positioned on a printed circuit board 500. But, the difference between the photoelectric conversion module according to the fifth embodiment and the photoelectric conversion module according to the fourth embodiment is in a connection structure to electrically connect the electric circuit device and the optical circuit device.

As illustrated in FIG. 8, unlike the photoelectric conversion module according to the fourth embodiment in which the semiconductor chip and the bare board are mounted on the printed circuit board by the bonding method using the connection bumps, in the photoelectric conversion module according to the fifth embodiment, a semiconductor chip 540 and a bare board 510 are directly mounted on the printed circuit board 500.

An optical waveguide array 511 is positioned within the bare board 510. A first electrode pad 514a and a second electrode pad 514b are positioned on one sidewall of the bare board 510. The optical waveguide array 511 is positioned between the first electrode pad 514a and the second electrode pad 514b.

An optical device array 520 is connected to the bare board 510 through first and second electrode bumps 519. The first and second electrode bumps 519 are connected to the first and second electrode pads 514a and 514b positioned the one sidewall of the bare board 510. An optical device 522 of the optical device array 520 connects the first and second electrode bumps 519 to the first and second electrode pads 514a and 514b, thereby being automatically connected to the optical waveguide array 511.

A first signal line 542 is positioned on the semiconductor chip 540 and the first signal lien 542 is bonded with a second signal line 529 positioned on the bare board 510 and a wire 518.

The photoelectric conversion module in the above-described structure according to the fifth embodiment of the present invention as illustrated in FIG. 8 has the following driving characteristics:

An electric signal being output from the semiconductor chip 540 including a drive circuit to drive the optical device array 520 is transmitted to the first signal line 542, and the electric signal transmitted through the first signal line 542 is transmitted to the second signal line 529 of the bare board 510 through the wire 518. The electric signal transmitted to the second signal line 529 passes through the second electrode pad 514b and the second electrode bump 519 and is transmitted to the optical device array 520. The optical device 522 (when it is a light emitting unit) converts the input electric signal into an optical signal and emits light. The optical signal emitted from the optical device 522 is transmitted through the optical waveguide array 511 of the bare board 510 in the direction of an arrow as shown.

Embodiment 6

Figure 9:
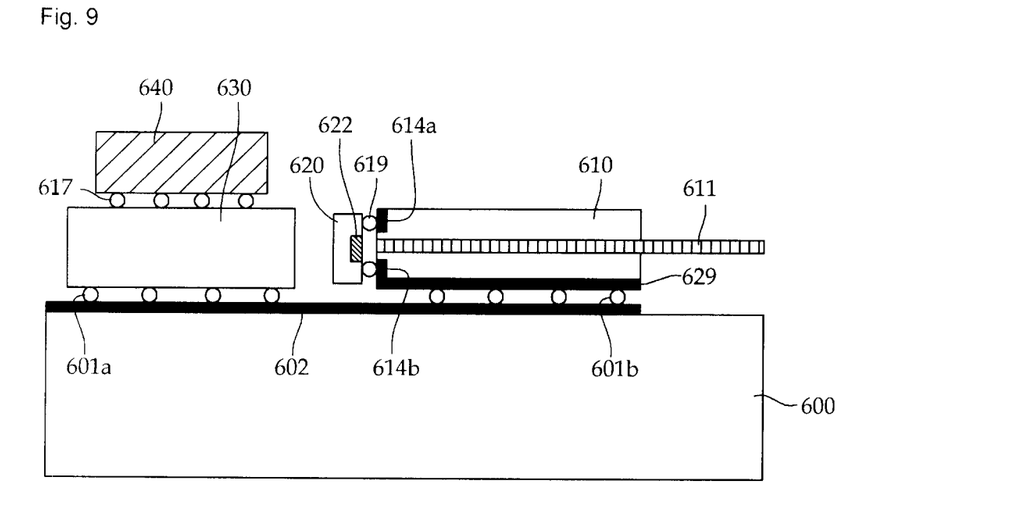
FIG. 9 is a sectional view illustrating a photoelectric conversion module according to a sixth embodiment of the present invention.

FIG. 9 is a sectional view illustrating a photoelectric conversion module according to a sixth embodiment of the present invention.

Referring to FIG. 9, like the photoelectric conversion module according to the fourth embodiment of the present invention, in the photoelectric conversion module according to the sixth embodiment of the present invention, an electric circuit device and an optical circuit device are independently and separately positioned on a printed circuit board 600. But, unlike the photoelectric conversion module according to the fourth embodiment in which the semiconductor chip is mounted on the printed circuit board by the flip chip bonding method, in the photoelectric conversion module according to the sixth embodiment, a semiconductor chip 640 is mounted on an integrated circuit board 630 which is mounted on the printed circuit board 600 by the flip chip bonding method.

As described above, unlike the fourth embodiment, the sixth embodiment provides the photoelectric conversion module in the structure in that the semiconductor chip 640 is not directly mounted on the printed circuit board 600 but is mounted on the integrated circuit board 630 mounted on the printed circuit board 600. When a drive circuit included in the semiconductor chip 640 operates at high speed, mounting the semiconductor chip 640 on the integrated circuit board 630, without directly mounting it on the printed circuit board 600, is economically advantageous.

In the photoelectric conversion module according to the sixth embodiment of the present invention, the integrated circuit board 630 is electrically connected to a top of the printed circuit board 600 by the flip chip bonding method using a first connection bump 601a. The integrated circuit board 630 is used as a medium to make it easy for the semiconductor chip 640 to be electrically connected to the printed circuit board 600.

In the semiconductor chip 640, there are a number of electrodes and the interval between the electrodes is only several tens of microns. Therefore, to directly connect the semiconductor chip 640 to the printed circuit board 600, the structure of the printed circuit board 600 is complicated and the cost is greatly increased. To prevent these problems, the integrated circuit board 630 is used as the electric connection medium between the semiconductor chip 640 and the printed circuit board 600, to electrically connect the semiconductor chip 640 and the printed circuit board 600.

A bare board 610 is mounted on the printed circuit board 600 by the flip chip bonding method. The bare board 610 is a pure board in which no integrated circuit is formed. The bare board 610 is composed of a material having dielectric properties. The optical waveguide array 611 is positioned within the bare board 610, and a first electrode pad 614a and a second electrode pad 614b are positioned on one sidewall of the bare board 610. The optical waveguide array 611 is positioned between the first electrode pad 614a and the second electrode pad 614b. A second signal line 629 which is connected to the second electrode pad 614b is positioned under the bare board 610.

An optical device array 620 is connected to the first and second electrode pads 614a and 614b of the bare board 610 through first and second electrode bumps 619. The optical device array 620 comprises an optical device (a light emitting unit or a light receiving unit) 622 optically connected to the optical waveguide array 611 in a horizontal direction.

The photoelectric conversion module in the above-described structure according to the sixth embodiment of the present invention as illustrated in FIG. 9 has the following driving characteristics:

An electric signal being output from the semiconductor chip 640 including the drive circuit to drive the optical device array 620 is transmitted to the integrated circuit board 630 through a third connection bump 617. The electric signal transmitted to the integrated circuit board 630 is transmitted to a first signal line 602 through a first connection bump 601a, and the electric signal transmitted to the first signal line 602 is transmitted to the second signal line 629 of the bare board 610 through a second connection bump 601b. The electric signal transmitted to the second signal line 629 is transmitted to the optical device array 620 through the second electrode pad 614b and the second electrode bump 619. The optical device array 620 converts the input electric signal into an optical signal and emits light through the optical device 622. The light emitted from the optical device 622 is transmitted through the optical waveguide array 611 of the bare board 610 positioned adjacently.

Embodiment 7

Figure 10:
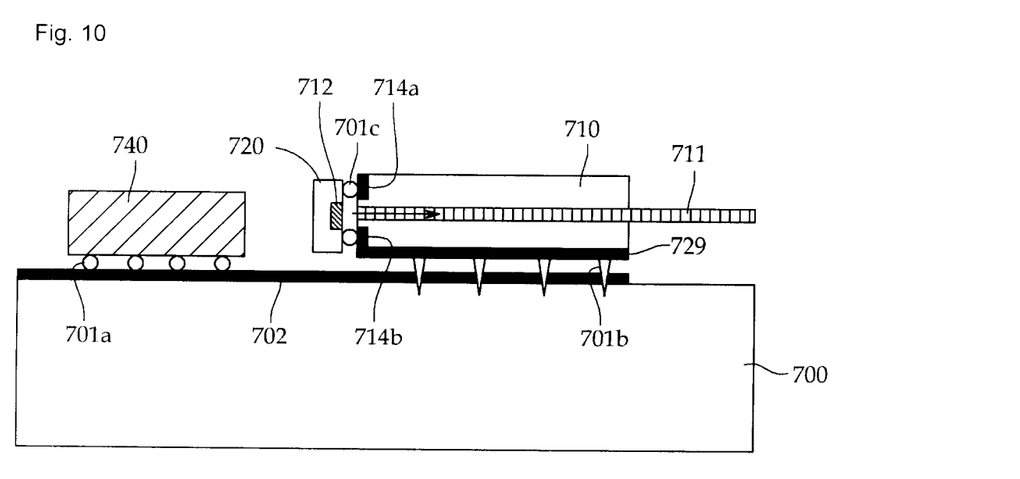
FIG. 10 is a sectional view illustrating a photoelectric conversion module according to a seventh embodiment of the present invention.

FIG. 10 is a sectional view illustrating a photoelectric conversion module according to a seventh embodiment of the present invention.

Referring to FIG. 10, like the photoelectric conversion module according to the fourth embodiment of the present invention, in the photoelectric conversion module according to the seventh embodiment of the present invention, an electric circuit device and an optical circuit device are independently and separately positioned on a printed circuit board 700. But, unlike the photoelectric conversion module according to the fourth embodiment, in the photoelectric conversion module according to the seventh embodiment, a bare board 710 is connected to a first signal line 702 positioned on the printed circuit board 700 through connection pins 701b.

Pin holes may be formed in an array form on the printed circuit board 700 so that the connection pins 701b are inserted to be coupled. The pin holes are composed of a material having conductivity. When the connection pins 701b are inserted to be coupled, the pin holes are electrically connected to the connection pins 701b. Further, when the connection pins 701b are inserted, the pin holes secure the connection pins 701b with predetermined pressure.

The connection pins 701b are also electrically connected to the first signal line 702 positioned on the printed circuit board 700. Through-holes may is be formed in the first signal line 702 so that the connection pins 701b pass through the through-holes. The connection pins 701b are inserted into the pin holes of the printed circuit board 700 through the through-holes of the first signal line 702.

The constitution other than the connection pins 701b and the pin holes is same as that described in the fourth embodiment. Therefore, the description of the fourth embodiment of the present invention will be referred to for a more detailed description of the other constitution according to the seventh embodiment.

As described, the photoelectric conversion module according to the seventh embodiment has the structure in that the bare board 710 is connected to the first signal line 702 positioned on the printed circuit board 700 through the connection pins 701b, unlike that according to the fourth embodiment. This is to improve the attachability/detachability of the bare board 710 to/from the printed circuit board 700 when the bare board 710 malfunctions. That is, the bare board 710 is connected to the printed circuit board 700 through the first signal line 702 by using the connection pins 701b which are relatively easily attachable/detachable. Therefore, when the bare board 710 malfunctions, it is easily separated from the printed circuit board 700, to be replaced.

The photoelectric conversion module in the above-described structure according to the seventh embodiment of the present invention as illustrated in FIG. 10 has the following driving characteristics:

An electric signal being output from a semiconductor chip 740 including a drive circuit to drive an optical device array 720 is transmitted to the first signal line 702 on the printed circuit board 700 through a connection bump 701a. The electric signal transmitted to the first signal line 702 is transmitted to a second signal line 729 of the bare board 710 through the connection pins 701b. The electric signal transmitted to the second signal line 729 passes through a second electrode pad 714b and a second electrode bump 701c and is transmitted to the optical device array 720. The optical device array 720 converts the input electric signal into an optical signal and emits light through an optical device 712 (when it is a light emitting unit). The optical signal emitted through the optical device 712 is transmitted through an optical waveguide array 711 in the direction of an arrow as shown.

As described above, in accordance with the present invention, the optical coupling between the optical waveguide array and the optical device is easily achieved by simply connecting the electrode pads positioned at the optical waveguide array to the electrode bumps positioned at the optical device array. Further, high-speedy and high-capacity electric signals between the large-scale integrations on the printed circuit board are easily and fast transmitted by the optical device array and the optical waveguide array. Further, as the optical device is directly coupled to the optical waveguide array, the interval between the optical device and the optical waveguide array is maintained within several to tens of microns, thereby obtaining excellent optical coupling efficiency, compared with a conventional photoelectric conversion module.

Therefore, the present invention has the following effects:

First, in accordance with the present invention, electrode pads are positioned at one sidewall of an optical waveguide array, and, through the electrode pads, an optical device is positioned to be automatically aligned (with the optical waveguide array) horizontally with the direction in which light is transmitted in the optical waveguide array, thereby improving the optical coupling efficiency and thus decreasing light loss.

Second, through the electrode pads positioned at the one sidewall of the optical waveguide array, the optical device is positioned to be automatically aligned horizontally with the direction in which light is transmitted in the optical waveguide array, thereby making it possible to maintain the distance between the optical device and the optical waveguide within several tens of microns and thus obtaining excellent optical coupling efficiency, compared to a conventional photoelectric conversion module.

Third, an electric circuit unit (semiconductor chip) and an optical circuit unit (optical waveguide array) of the photoelectric conversion module which are physically separated from each other are positioned on a printed circuit board, thereby making it possible to independently replacing the electric circuit unit or optical circuit unit when it malfunctions and thus simplifying repairs.

Fourth, since the optical device is positioned to be aligned horizontally with the direction in which light is transmitted in the optical waveguide array, no constituent elements, such as a micro mirror or a lens used in the conventional to photoelectric conversion module, are required. Thus, the number of the constituent elements is decreased, compared to the prior art. This enables the mass production of the photoelectric conversion module and decreases the manufacturing cost.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A photoelectric conversion module, comprising:
    a printed circuit board;
    an integrated circuit board mounted on the printed circuit board, wherein an optical waveguide array passing through from one side to the other side of the integrated circuit board is integrated into the integrated circuit board, and first and second electrode pads are positioned at one sidewall of the integrated circuit board and third and fourth electrode pads are positioned at another sidewall of the integrated circuit board, wherein the integrated circuit board is configured to provide an electrical connection and an optical connection in a continuous common layer;
    a first optical device array, wherein first and second electrode bumps to be respectively connected to the first and second electrode pads are positioned at one sidewall of the first optical device array facing the integrated circuit board, and a first optical device is positioned in a middle part of the first optical device array;
    a second optical device array, wherein third and fourth electrode bumps to be respectively connected to the third and fourth electrode pads are positioned at one sidewall of the second optical device array facing the integrated circuit board, and a second optical device is positioned in a middle part of the second optical device array;
    at least one semiconductor chip mounted on the integrated circuit board;
    a first connection bump to connect the integrated circuit board and the printed circuit board;
    a signal line positioned on the integrated circuit board and connected to the first electrode pad and the third electrode pad; and
    a second connection bump to connect the semiconductor chip and the signal line.

2. The photoelectric conversion module according to claim 1, wherein
    the first and second electrode pads are positioned to generate optical coupling between the optical waveguide array and the first optical device when the first and second electrode pads are connected to the first and second electrode bumps, and
    the third and fourth electrode pads are positioned to generate optical coupling between the optical waveguide array and the second optical device when the first and second electrode pads are connected to the third and fourth electrode bumps.

3. The photoelectric conversion module of claim 1, further comprising:
    an electrical wire formed inside the printed circuit board and configured to transmit an electrical signal passing through the integrated circuit board to a drive circuit of the at least one semiconductor chip mounted on the integrated circuit board, wherein the electric signal for the drive circuit is transmitted to the first and second optical devices through the second connection bump and the signal line.

4. The photoelectric conversion module of claim 1, wherein the first optical device of the first optical device array is a light emitting unit configured to convert an electrical signal into an optical signal and transmit the optical signal to the second optical device of the second optical device array through the optical waveguide array.

5. The photoelectric conversion module of claim 4, wherein the second optical device is a light receiving unit configured to convert the optical signal transmitted from the first optical device into an electric signal and transmit the converted electrical signal to the at least one semiconductor chip through the signal line.

6. A photoelectric conversion module, comprising:
    a printed circuit board;
    a bare board mounted on the printed circuit board, wherein an optical waveguide array passing through from one side to the other side of the bare board is integrated into the bare board, and first and second electrode pads are positioned at one sidewall of the bare board, wherein the bare board is configured to provide an electrical connection and an optical connection in a continuous common layer, and wherein no integrated circuit and no alignment element or structure are formed in the bare board;
    an optical device array, wherein first and second electrode bumps to be respectively connected to the first and second electrode pads are positioned at one sidewall of the optical device array facing the bare board, and an optical device is positioned in a middle part of the optical device array;
a semiconductor chip mounted on the printed circuit board, wherein the semiconductor chip and the bare board are separately mounted on the printed circuit board;
a first signal line positioned on the printed circuit board;
a second signal line positioned at a surface of a bottom wall of the bare board and connected to the second electrode pad;
a first connection bump to connect the semiconductor chip and the first signal line; and
a second connection bump to connect the first signal line and the second signal line,
wherein the first and second electrode pads are positioned to generate optical coupling between the optical waveguide array and the optical device when the first and second electrode pads are connected to the first and second electrode bumps.

* * * * *